(12) United States Patent
Yu et al.

(10) Patent No.: US 11,031,352 B2
(45) Date of Patent: Jun. 8, 2021

(54) ROUTING DESIGN OF DUMMY METAL CAP AND REDISTRIBUTION LINE

(71) Applicant: Taiwan Semiconductor Manufacturing Company, Ltd., Hsinchu (TW)

(72) Inventors: Chen-Hua Yu, Hsinchu (TW); Hsien-Wei Chen, Hsinchu (TW); Meng-Tsan Lee, Hsinchu (TW); Tsung-Shu Lin, New Taipei (TW); Wei-Cheng Wu, Hsinchu (TW); Chien-Chia Chiu, Zhongli (TW); Chin-Te Wang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 86 days.

(21) Appl. No.: 16/511,777

(22) Filed: Jul. 15, 2019

(65) Prior Publication Data
US 2019/0341360 A1    Nov. 7, 2019

Related U.S. Application Data

(60) Continuation of application No. 15/978,621, filed on May 14, 2018, now Pat. No. 10,354,961, which is a
(Continued)

(51) Int. Cl.
*H01L 21/48*    (2006.01)
*H01L 23/00*    (2006.01)
(Continued)

(52) U.S. Cl.
CPC ........ *H01L 23/562* (2013.01); *H01L 21/4853* (2013.01); *H01L 21/4857* (2013.01);
(Continued)

(58) Field of Classification Search
CPC ....... H01L 24/19; H01L 24/20; H01L 23/562; H01L 21/561; H01L 21/568;
(Continued)

(56) References Cited

U.S. PATENT DOCUMENTS

| 8,361,842 B2 | 1/2013 | Yu et al. |
| 8,680,647 B2 | 3/2014 | Yu et al. |

(Continued)

FOREIGN PATENT DOCUMENTS

| CN | 105679741 A | 6/2016 |
| KR | 20110130521 A | 12/2011 |
| KR | 20140104833 A | 8/2014 |

*Primary Examiner* — Charles D Garber
*Assistant Examiner* — S M Sohel Imtiaz
(74) *Attorney, Agent, or Firm* — Slater Matsil, LLP

(57) ABSTRACT

A package includes a first dielectric layer, a device die over and attached to the first dielectric layer, an active through-via and a dummy through-via, and an encapsulating material encapsulating the device die, the active through-via, and the dummy through-via. The package further includes a second dielectric layer over and contacting the device die, the active through-via, and the dummy through-via. An active metal cap is over and contacting the second dielectric layer and electrically coupling to the active through-via. The active metal cap overlaps the active through-via. A dummy metal cap is over and contacting the second dielectric layer. The dummy metal cap overlaps the dummy through-via. The dummy metal cap is separated into a first portion and a second portion by a gap. A redistribution line passes through the gap between the first portion and the second portion of the dummy metal cap.

20 Claims, 21 Drawing Sheets

Related U.S. Application Data division of application No. 15/426,757, filed on Feb. 7, 2017, now Pat. No. 9,972,581.

(51) Int. Cl.

| | | |
|---|---|---|
| *H01L 23/538* | (2006.01) | |
| *H01L 23/31* | (2006.01) | |
| *H01L 21/56* | (2006.01) | |
| *H01L 25/10* | (2006.01) | |
| *H01L 25/00* | (2006.01) | |
| *H01L 23/498* | (2006.01) | |
| *H01L 21/683* | (2006.01) | |

(52) U.S. Cl.
CPC .......... *H01L 21/561* (2013.01); *H01L 21/565* (2013.01); *H01L 21/568* (2013.01); *H01L 21/6835* (2013.01); *H01L 23/3114* (2013.01); *H01L 23/49811* (2013.01); *H01L 23/5383* (2013.01); *H01L 23/5389* (2013.01); *H01L 24/19* (2013.01); *H01L 24/20* (2013.01); *H01L 25/105* (2013.01); *H01L 25/50* (2013.01); *H01L 21/486* (2013.01); *H01L 23/3128* (2013.01); *H01L 23/49816* (2013.01); *H01L 23/5384* (2013.01); *H01L 23/5386* (2013.01); *H01L 2221/68318* (2013.01); *H01L 2221/68359* (2013.01); *H01L 2221/68372* (2013.01); *H01L 2224/04105* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01); *H01L 2924/181* (2013.01); *H01L 2924/3511* (2013.01)

(58) Field of Classification Search
CPC .......... H01L 21/6835; H01L 23/49811; H01L 23/5389; H01L 23/5383; H01L 23/3114; H01L 21/4857; H01L 21/565; H01L 25/105; H01L 25/50; H01L 23/3128; H01L 2221/28318; H01L 2221/68359; H01L 2221/68372
See application file for complete search history.

(56) References Cited

U.S. PATENT DOCUMENTS

| | | | |
|---|---|---|---|
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,612,615 B2 | 4/2017 | Lin et al. | |
| 10,872,852 B2* | 12/2020 | Shih | H01L 21/486 |
| 2007/0284726 A1* | 12/2007 | Lin | H01L 23/525 257/698 |
| 2009/0184414 A1* | 7/2009 | Park | H01L 24/96 257/698 |
| 2009/0309212 A1* | 12/2009 | Shim | H01L 23/3107 257/700 |
| 2010/0133704 A1* | 6/2010 | Marimuthu | H01L 24/16 257/778 |
| 2011/0248404 A1 | 10/2011 | Chiu et al. | |
| 2011/0291288 A1 | 12/2011 | Wu et al. | |
| 2011/0298097 A1* | 12/2011 | Sueyoshi | H01L 24/05 257/621 |
| 2012/0119373 A1* | 5/2012 | Hunt | H01L 21/4857 257/774 |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0093097 A1* | 4/2013 | Yu | H01L 24/81 257/774 |
| 2013/0168848 A1 | 7/2013 | Lin et al. | |
| 2013/0307140 A1 | 11/2013 | Huang et al. | |
| 2013/0341803 A1* | 12/2013 | Cheah | H01L 23/3142 257/774 |
| 2014/0070407 A1* | 3/2014 | Lee | H01L 23/5389 257/737 |
| 2014/0203429 A1 | 7/2014 | Yu et al. | |
| 2014/0210099 A1* | 7/2014 | Hu | H01L 24/06 257/774 |
| 2014/0225222 A1 | 8/2014 | Yu et al. | |
| 2014/0252646 A1* | 9/2014 | Hung | H01L 21/486 257/774 |
| 2014/0264930 A1 | 9/2014 | Yu et al. | |
| 2015/0108635 A1* | 4/2015 | Liang | H01L 25/0657 257/737 |
| 2015/0255432 A1* | 9/2015 | Lin | H01L 24/09 257/774 |
| 2015/0357320 A1* | 12/2015 | Yu | H01L 21/565 438/109 |
| 2016/0020170 A1* | 1/2016 | Ho | H01L 24/45 257/774 |
| 2016/0035666 A1* | 2/2016 | Huang | H01L 24/19 257/666 |
| 2016/0093572 A1 | 3/2016 | Chen | |
| 2016/0163564 A1 | 6/2016 | Yu et al. | |

\* cited by examiner

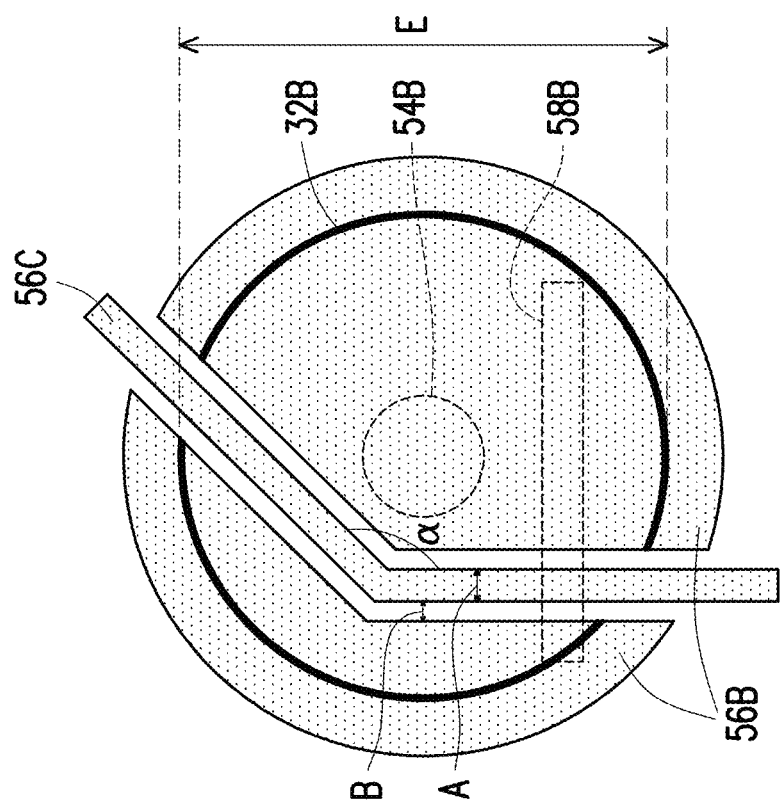
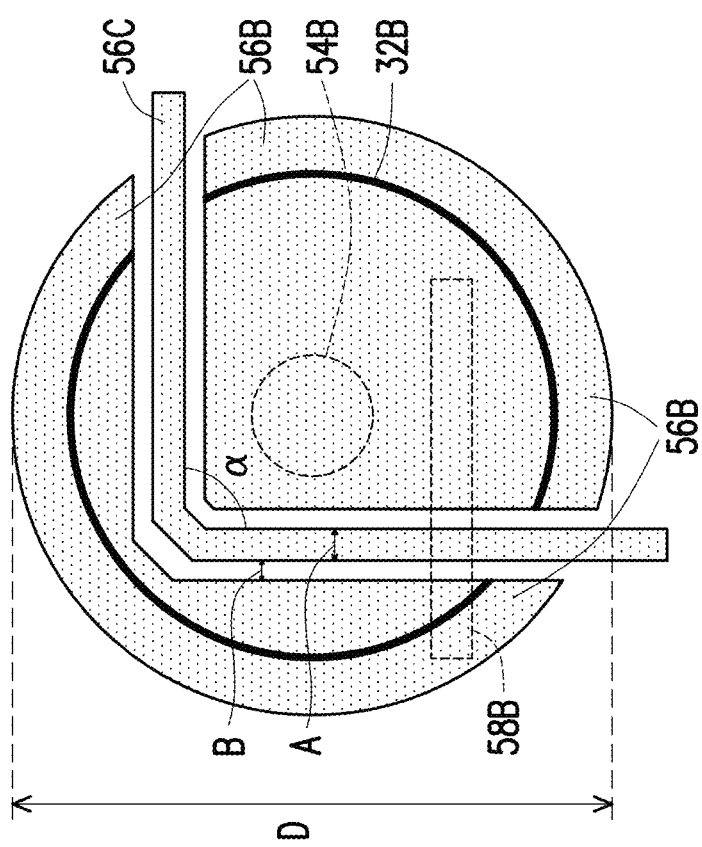
FIG. 20
FIG. 21

ROUTING DESIGN OF DUMMY METAL CAP AND REDISTRIBUTION LINE

PRIORITY CLAIM AND CROSS-REFERENCE

This application is a continuation of U.S. patent application Ser. No. 15/978,621, filed May 14, 2018, and entitled "Routing Design of Dummy Metal Cap and Redistribution Line," which is a divisional of U.S. patent application Ser. No. 15/426,757, filed Feb. 7, 2017, and entitled "Routing Design of Dummy Metal Cap and Redistribution Line," now U.S. Pat. No. 9,972,581 issued May 15, 2018, which applications are hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

In a fan-out package, a device dies is encapsulated in a molding compound, which is then planarized to expose the device die. Redistribution lines are then formed to connect to the device die. The fan-out package may also include through-vias penetrating through the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 18 through 21 are top views of dummy metal caps in accordance with some embodiments.

DETAILED DESCRIPTION

Figure 1:
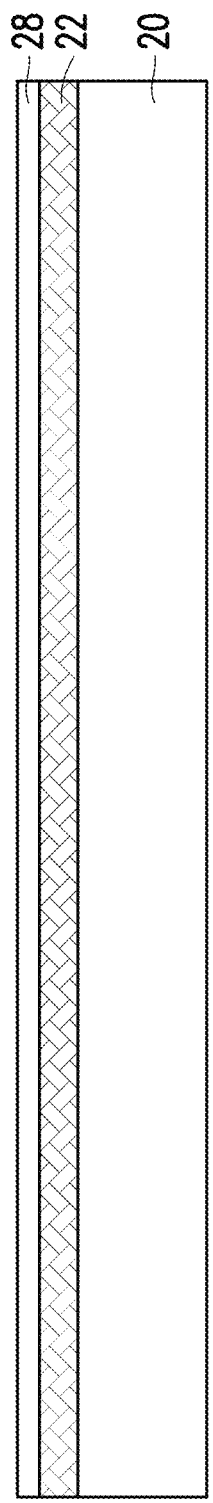
FIGS. 1 through 14 are cross-sectional views of intermediate stages in the formation of a package including front-side redistribution lines in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with various exemplary embodiments. The intermediate stages of forming the package are illustrated in accordance with some embodiments. Some variations of some embodiments are discussed. Throughout the various views and illustrative embodiments, like reference numbers are used to designate like elements.

Figure 22:
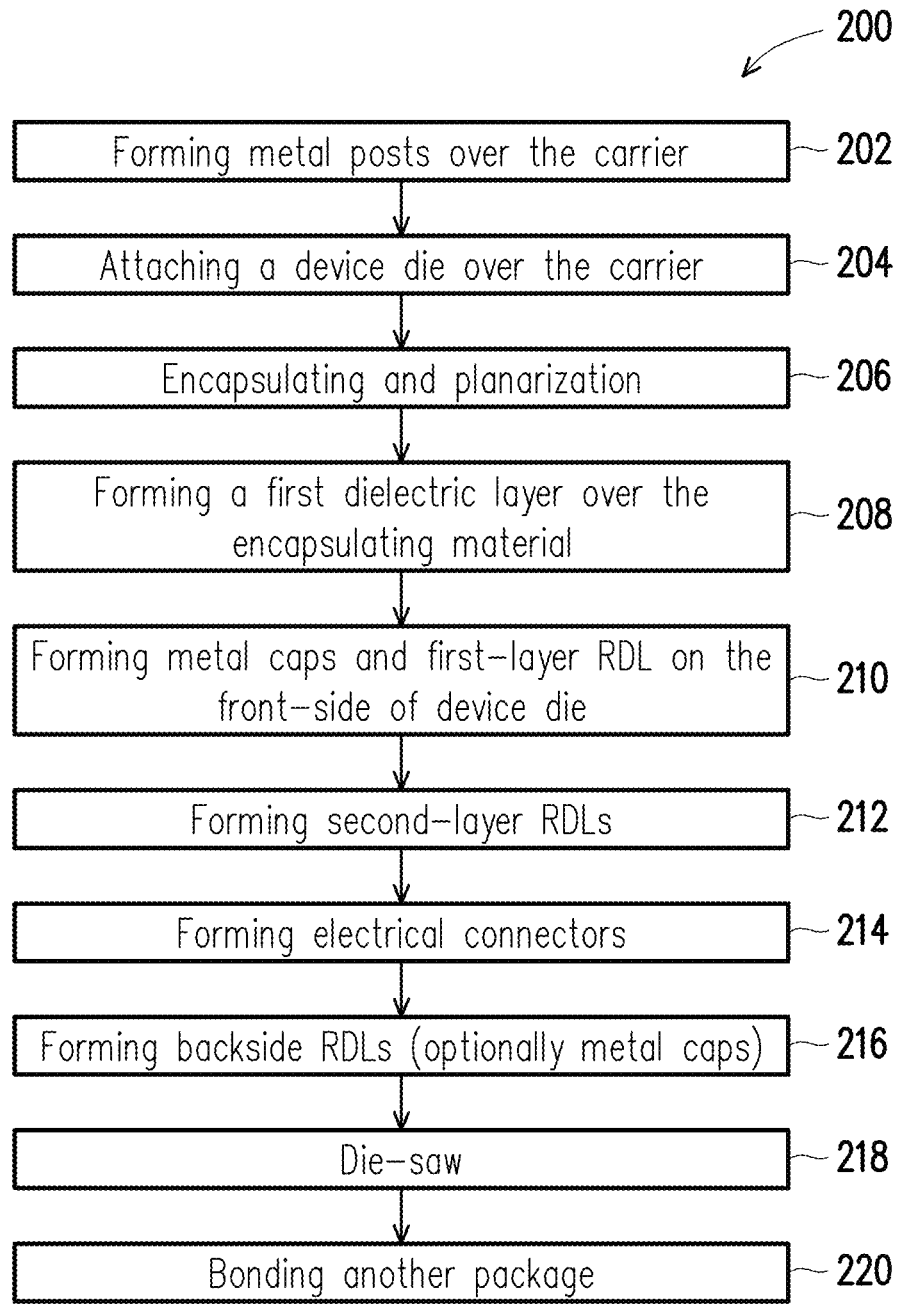
FIG. 22 illustrates a process flow for forming a package in accordance with some embodiments.

FIGS. 1 through 14 illustrate the cross-sectional views of intermediate stages in the formation of a package in accordance with some embodiments. The steps shown in FIG. 1 through 14 are also illustrated schematically in the process flow 200 shown in FIG. 22.

FIG. 1 illustrates carrier 20 and release layer 22 coated on carrier 20. Carrier 20 may be a glass carrier, a ceramic carrier, or the like. Carrier 20 may have a round top-view shape, and may have a size of a silicon wafer. For example, carrier 20 may have an 8-inch diameter, a 12-inch diameter, or the like. Release layer 22 may be formed of a Light To Heat Conversion (LTHC) coating material, which may be removed along with carrier 20 from the overlying structures that will be formed in subsequent steps. In accordance with some embodiments of the present disclosure, release layer 22 is formed of an epoxy-based thermal-release material. Release layer 22 may be coated onto carrier 20.

Dielectric layer 28 is formed over release layer 22. The bottom surface of dielectric layer 28 may be in contact with the top surface of release layer 22. In accordance with some embodiments of the present disclosure, dielectric layer 28 is formed of a polymer, which may be a photo-sensitive material such as polybenzoxazole (PBO), polyimide, benzocyclobutene (BCB), or the like. In accordance with alternative embodiments, dielectric layer 28 is formed of an inorganic dielectric material, which may be a nitride such as silicon nitride, an oxide such as silicon oxide, PSG, BSG, BPSG, or the like.

Figure 2:
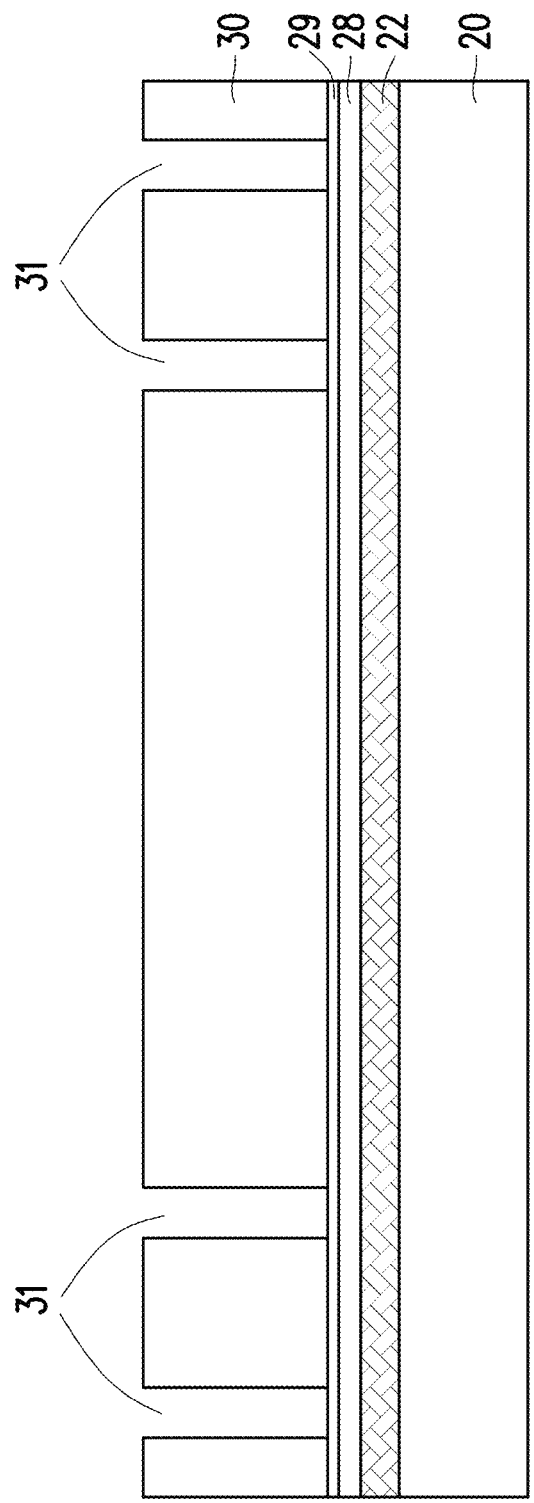
Figure 3:
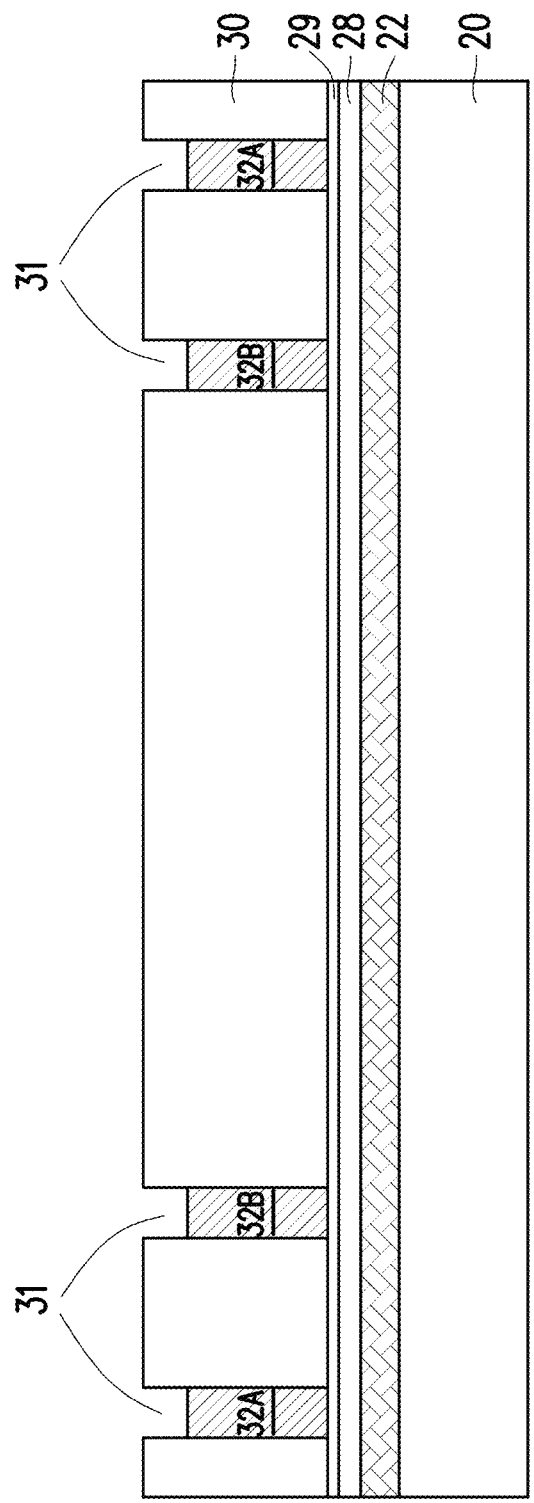
Figure 4:
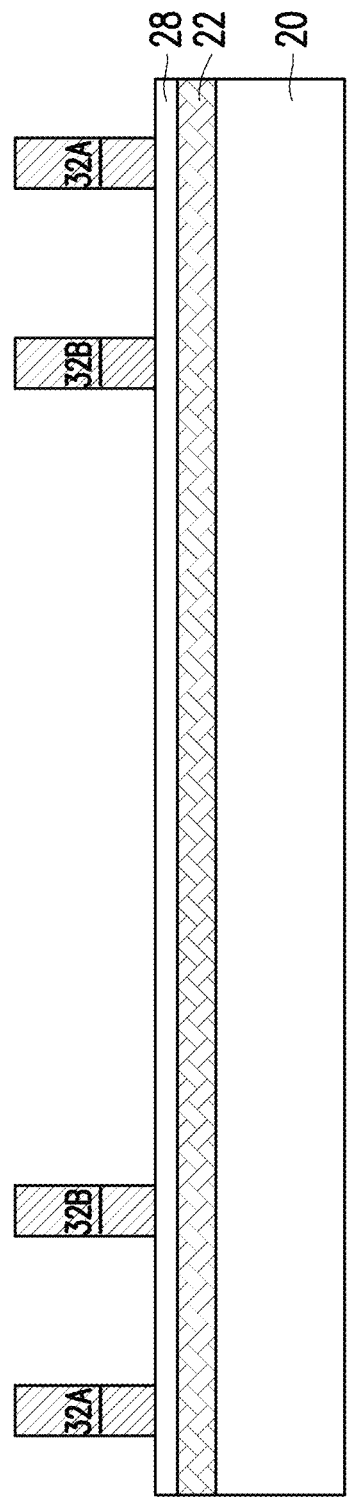

FIGS. 2 through 4 illustrate the formation of metal posts 32A and 32B, which are collectively referred to as metal posts 32. The respective step is illustrated as step 202 in the process flow shown in FIG. 22. Throughout the description, metal posts 32 are alternatively referred to as through-vias 32 since metal posts 32 penetrate through the subsequently dispensed encapsulating material.

Referring to FIG. 2, metal seed layer 29 is formed, for example, through Physical Vapor Deposition (PVD). Metal seed layer 29 may include copper, or may include a titanium layer and a copper layer over the titanium layer in accordance with some embodiments. Photo resist 30 is formed over metal seed layer 29. A light-exposure is then performed on photo resist 30 using a photo lithography mask (not shown). After a subsequent development, openings 31 are formed in photo resist 30. Some portions of metal seed layer 29 are exposed through openings 31.

Next, as shown in FIG. 3, through-vias 32 (including 32A and 32B) are formed by plating a metallic material in openings 31. The plated metallic material may be copper or a copper alloy. In subsequent steps, photo resist 30 is removed, and hence the underlying portions of metal seed layer 29 are exposed. The exposed portions of metal seed layer 29 are then removed in an etching step. The resulting through-vias 32 are illustrated in FIG. 4. Throughout the description, the remaining portions of metal seed layer 29 are considered as parts of through-vias 32, and are not illustrated separately. Through-vias 32 include functional (active) through-vias 32A and dummy vias 32B, whose functions will be discussed in subsequent paragraphs.

Figure 5:
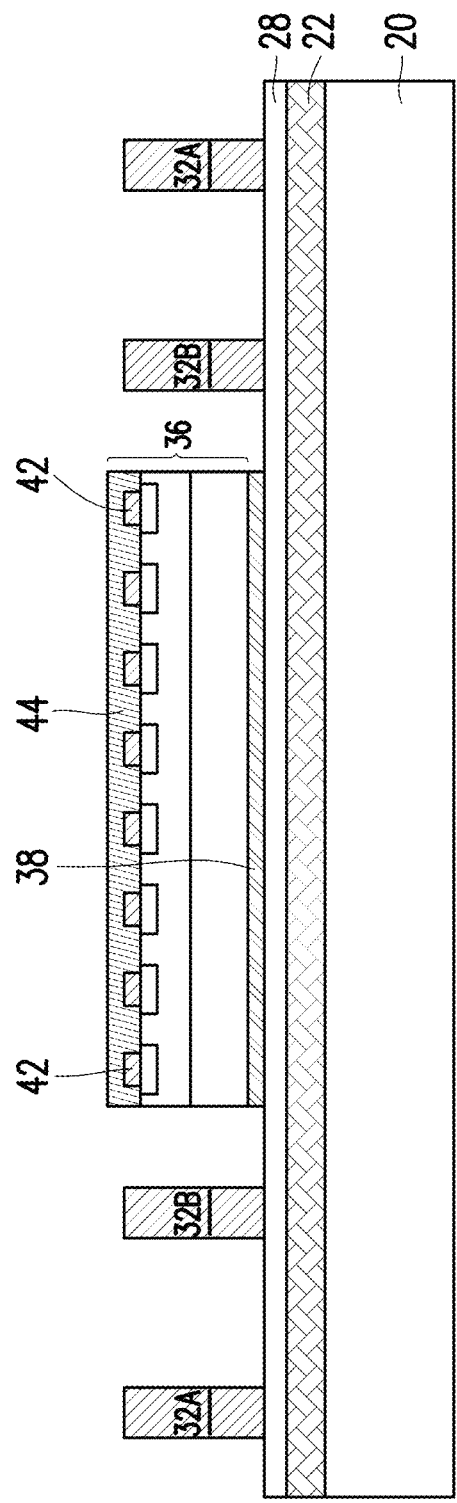

FIG. 5 illustrates the placement/attachment of device die 36. The respective step is illustrated as step 204 in the process flow shown in FIG. 22. Device die 36 is attached to dielectric layer 28 through Die-Attach Film (DAF) 38, which is an adhesive film. Device die 36 may include a semiconductor substrate having a back surface (the surface facing down) in physical contact with DAF 38. Device die 36 may include integrated circuit devices (such as active devices, which include transistors, for example, not shown) at the front surface (the surface facing up) of the semiconductor substrate. Device die 36 may be a logic die such as a Central Processing Unit (CPU) die, a Graphic Processing Unit (GPU) die, a mobile application die, or the like.

In accordance with some exemplary embodiments, metal pillars 42 (such as copper pillars) are pre-formed as portions of device die 36, wherein metal pillars 42 are electrically coupled to the integrated circuit devices such as transistors (not shown) in device die 36. In accordance with some embodiments of the present disclosure, a polymer fills the gaps between neighboring metal pillars 42 to form top dielectric layer 44. Top dielectric layer 44 may also include a portion covering and protecting metal pillars 42. Polymer layer 44 may be formed of PBO or polyimide in accordance with some embodiments of the present disclosure.

Figure 6:
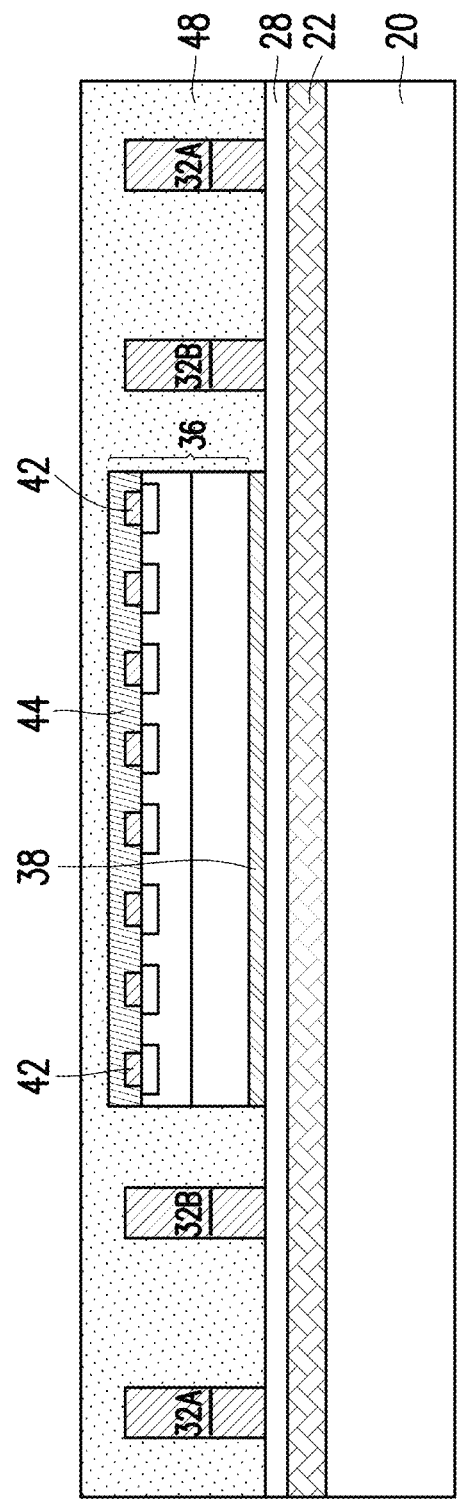

Next, device die 36 and metal posts 32 are encapsulated by encapsulating material 48, as shown in FIG. 6. The respective step is illustrated as step 206 in the process flow shown in FIG. 22. Encapsulating material 48 fills the gaps between neighboring through-vias 32 and the gaps between through-vias 32 and device die 36. Encapsulating material 48 may include a molding compound, a molding underfill, an epoxy, and/or a resin. The top surface of encapsulating material 48 is higher than the top ends of metal pillars 42. The molding compound may include a base material, which may be a polymer, a resin, an epoxy, or the like, and filler particles (not shown) in the base material. The filler particles may be dielectric particles of $SiO_2$, $Al_2O_3$, silica, or the like, and may have spherical shapes.

Figure 7:
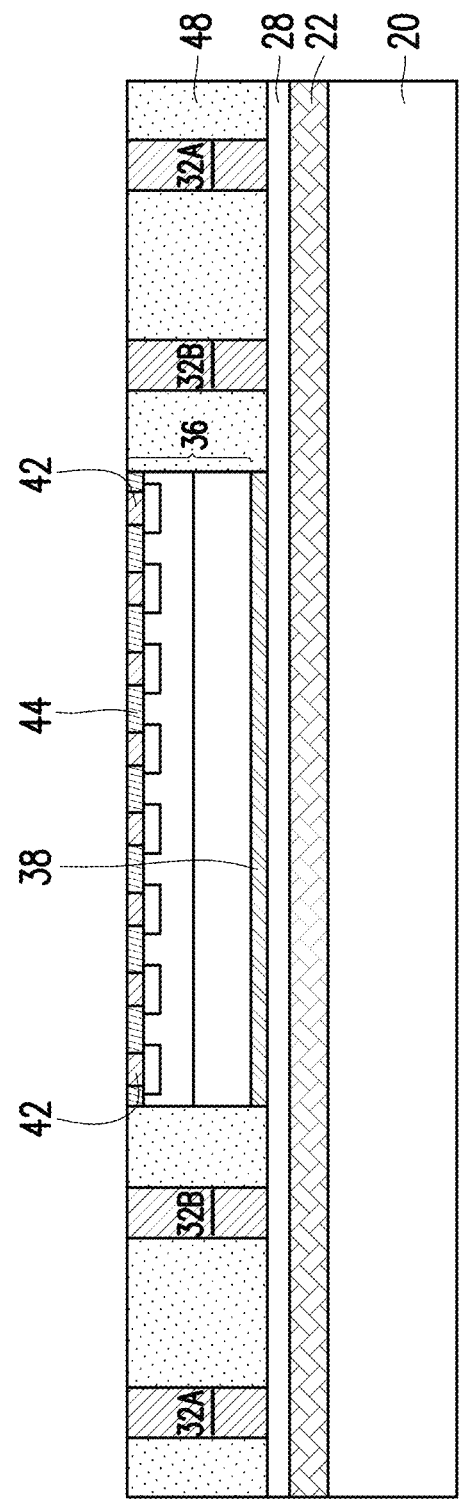

In a subsequent step, as shown in FIG. 7, a planarization such as a Chemical Mechanical Polish (CMP) step or a mechanical grinding step is performed to thin encapsulating material 48, until through-vias 32 and metal pillars 42 are exposed. The respective step is also illustrated as step 206 in the process flow shown in FIG. 22. Due to the planarization, the top ends of through-vias 32 are substantially level (coplanar) with the top surfaces of metal pillars 42, and are substantially coplanar with the top surface of encapsulating material 48.

Figure 8:
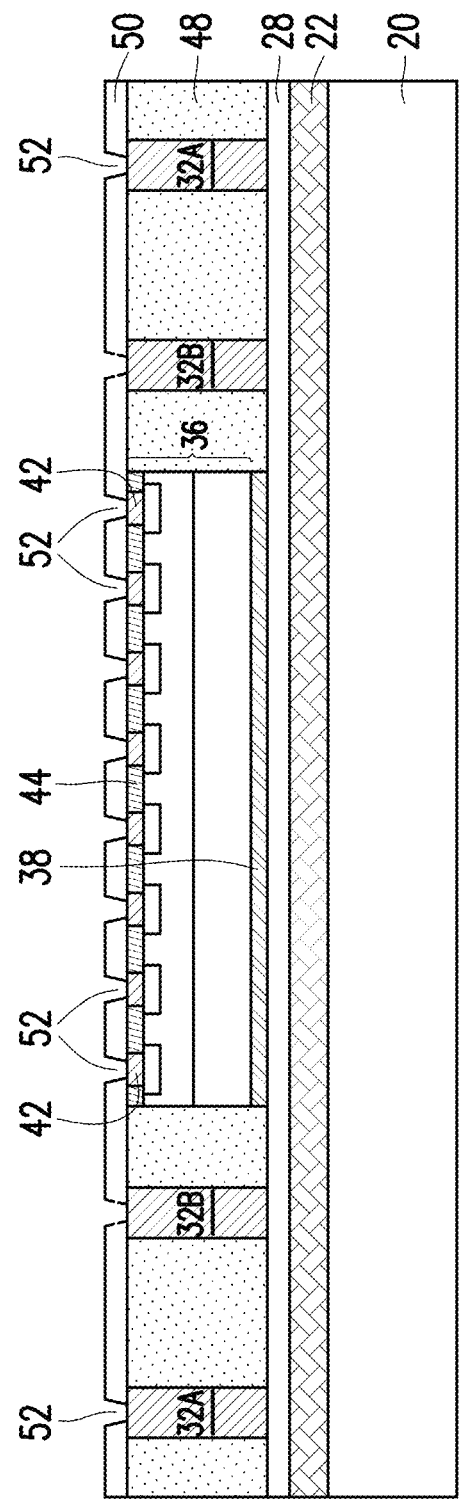
Figure 9:
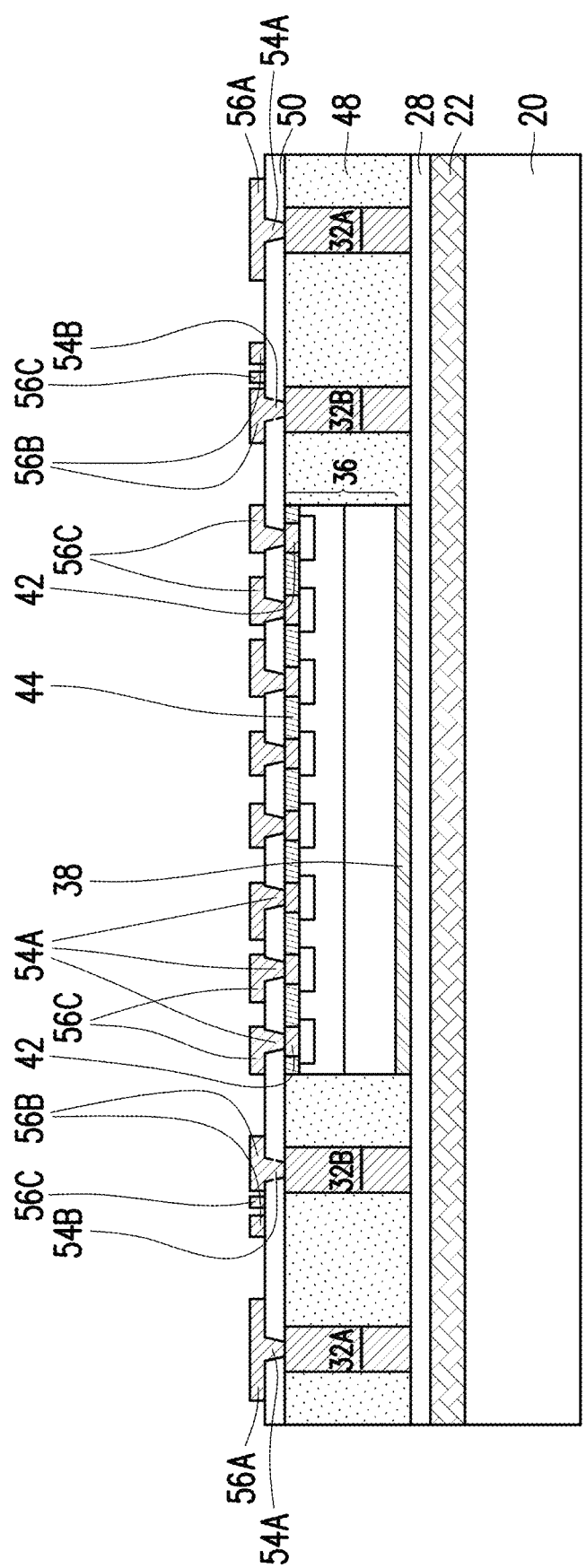

FIGS. 8 and 9 illustrate the formation of a first layer of front-side RDLs and the respective dielectric layer. Referring to FIG. 8, dielectric layer 50 is formed. The respective step is illustrated as step 208 in the process flow shown in FIG. 22. In accordance with some embodiments of the present disclosure, dielectric layer 50 is formed of a polymer such as PBO, polyimide, or the like. In accordance with alternative embodiments, dielectric layer 50 is formed of silicon nitride, silicon oxide, or the like. Openings 52 are then formed, for example, through a photo lithography process. Active through-vias 32A and metal pillars 42 are exposed through openings 52. In accordance with some embodiments of the present disclosure, dummy vias 32B are exposed through openings 52. In accordance with alternative embodiments of the present disclosure, no openings 52 are formed to expose some or all of dummy through-vias 32B, and hence some or all dummy through-vias 32B are still fully covered by dielectric layer 50 after the formation of openings 52.

Next, referring to FIG. 9, metal features 56 (including 56A, 56B, and 56C) are formed over dielectric layer 50. Conductive features 56 include (active) metal caps 56A, dummy metal caps 56B, and Redistribution Lines (RDLs) 56C over dielectric layer 50, wherein features 56A, 56B, and 56C are in the same metal layer and are at the same level. The respective step is illustrated as step 210 in the process flow shown in FIG. 22. Vias 54A are formed in dielectric layer 50 to connect metal pillars 42 and active through-vias 32A to the overlying metal caps 56A and RDLs 56C. RDLs 56C include metal traces (metal lines) over dielectric layer 50. In accordance with some embodiments of the present disclosure, metal features 56 and vias 54 (including 54A and 54B) are formed in a plating process, which includes depositing a seed layer (not shown), forming and patterning a photo resist (not shown) over the seed layer, and plating a metallic material such as copper or aluminum over the seed layer. The seed layer and the plated material may be formed of the same material or different materials. The patterned photo resist is then removed, followed by etching the portions of the seed layer previously covered by the patterned photo resist.

Metal caps 56A overlap the corresponding active through-vias 32A, and dummy metal caps 56B overlap the corresponding dummy through-vias 32B. Metal caps 56A and dummy metal caps 56B are larger than through-vias 32 so that the stress caused by the respective underlying through-vias 32A and 32B are shielded. In accordance with some embodiments in which openings 52 (FIG. 8) are formed to expose dummy through-vias 32B, dummy vias 54B are formed in dielectric layer 50, and physically and electrically connect some or all dummy metal caps 56B to dummy through-vias 32B. In accordance with alternative embodiments, no opening 52 (FIG. 8) is formed to expose dummy through-vias 32B, and dummy metal caps 56B are separated from the underlying dummy through-vias 32B by dielectric layer 50. Accordingly, dummy vias 54B are shown using dashed lines to indicate they may or may not be formed, and some dummy vias 54B may be formed, while others are not formed.

As also shown in FIG. 9, dummy metal caps 56B are separated into two (or more) portions, with RDLs 56C passing through the gap/space between the separated portions of dummy metal caps 56B. Metal caps 56A and dummy metal caps 56B may have round top-view shapes, as shown in FIGS. 17 through 21, so that the stress applied by them to the surrounding dielectric structures is minimized. In accordance with alternative embodiments, metal caps 56A and dummy metal caps 56B may have other polygonal shapes such as hexagonal shapes, octagonal shapes, or the like. RDLs 56C may be connected to metal caps 56A, vias 54A, metal pillars 42, and other line conductive features. RDLs 56C are used to conduct voltages, signals, powers, and the like.

Figure 10:
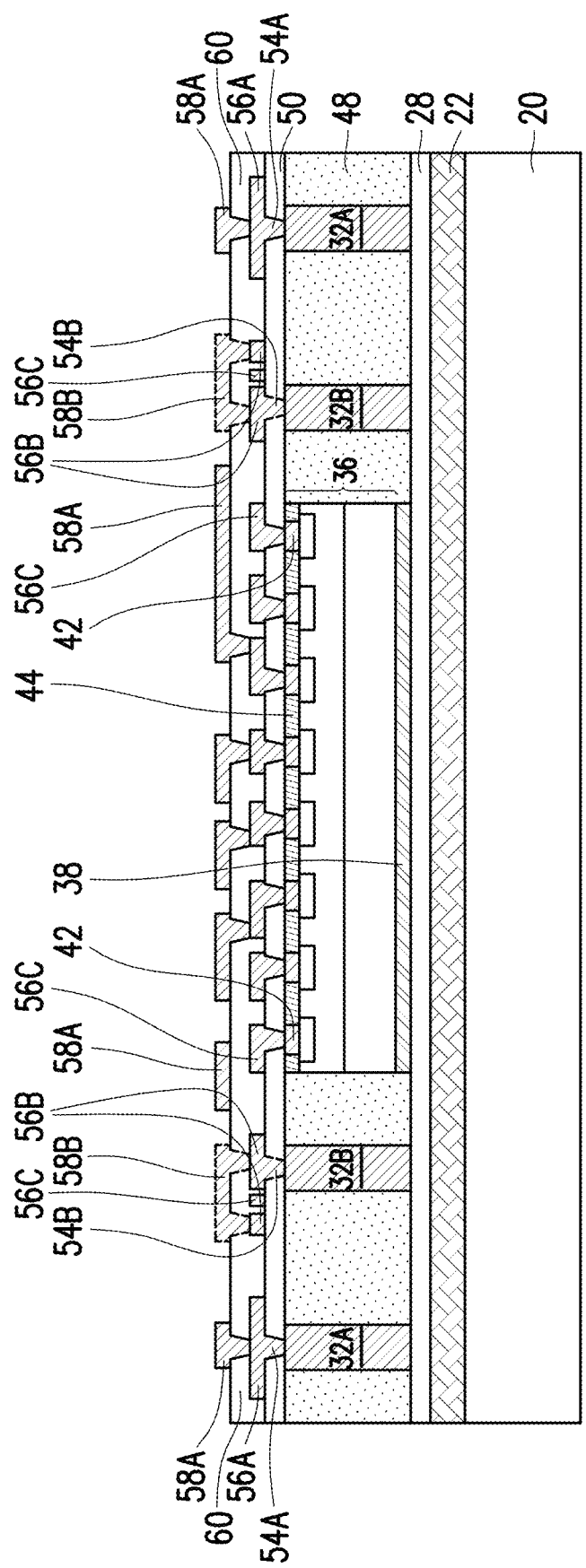

Referring to FIG. 10, in accordance with some embodiments of the present disclosure, dielectric layer 60 is formed over the structure shown in FIG. 9, followed by the formation of openings in dielectric layer 60. Some portions of metal caps 56A and RDLs 56C are thus exposed through the openings. Dielectric layer 60 may be formed using a material selected from the same candidate materials for forming dielectric layer 50, which may include PBO, polyimide, or BCB. Metal features (RDLs) 58, which include 58A and possibly 58B, are then formed. RDLs 58A extend into the openings in dielectric layer 60 to contact metal caps 56A and/or RDLs 56C. The respective step is illustrated as step 212 in the process flow shown in FIG. 22.

In accordance with some embodiments of the present disclosure, some of RDLs 58 (marked as 58B, which are also referred to as metal bridges) are formed to interconnect the separated portions of dummy metal caps 56B. As a result, the separated portions of the same dummy metal cap 56B and the respective overlying metal bridges 58B in combination form integrated metal features. Accordingly, metal bridges 58B may improve the integrity of dummy metal caps 56B, and hence the stress shielding effect of dummy metal caps 56B is improved.

In accordance with alternative embodiments of the present disclosure, some or all metal bridges 58B are not formed. Accordingly, the separated portions of the same dummy metal cap 56A are electrically disconnected from each other, with no metal feature interconnecting them. Metal bridges 58B are thus illustrated using dashed lines to indicate that some or all of metal bridges 58B may or may not be formed. When a dummy metal cap 56B doesn't have an overlying connecting metal bridge, the entire top surface of each of the separated portions of the dummy metal cap 56B is fully covered by dielectric layer 60. Furthermore, one or more of the separated portions of a dummy metal cap 56B may be fully enclosed by dielectric layers 50 and 60.

Figure 11:
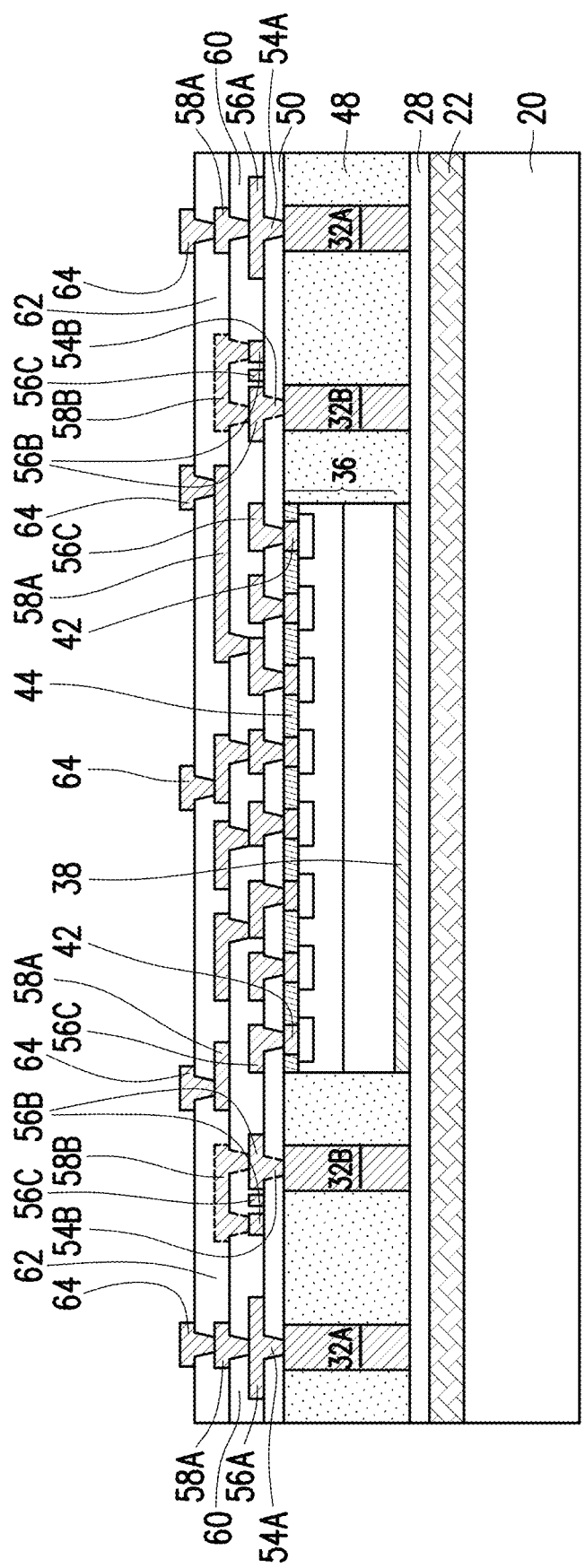

FIG. 11 illustrates the formation of dielectric layer 62 and RDLs 64. Dielectric layer 62 may be formed of a material selected from the same group of candidate materials for forming dielectric layers 50 and 60. RDLs 64 may also be formed of a metal or a metal alloy including aluminum, copper, tungsten, and/or alloys thereof. It is appreciated that although in the illustrated exemplary embodiments, three layers of RDLs (56, 58 and 64) are formed, the number of RDLs may have any number of layers such as one layer or more than two layers.

Figure 12:
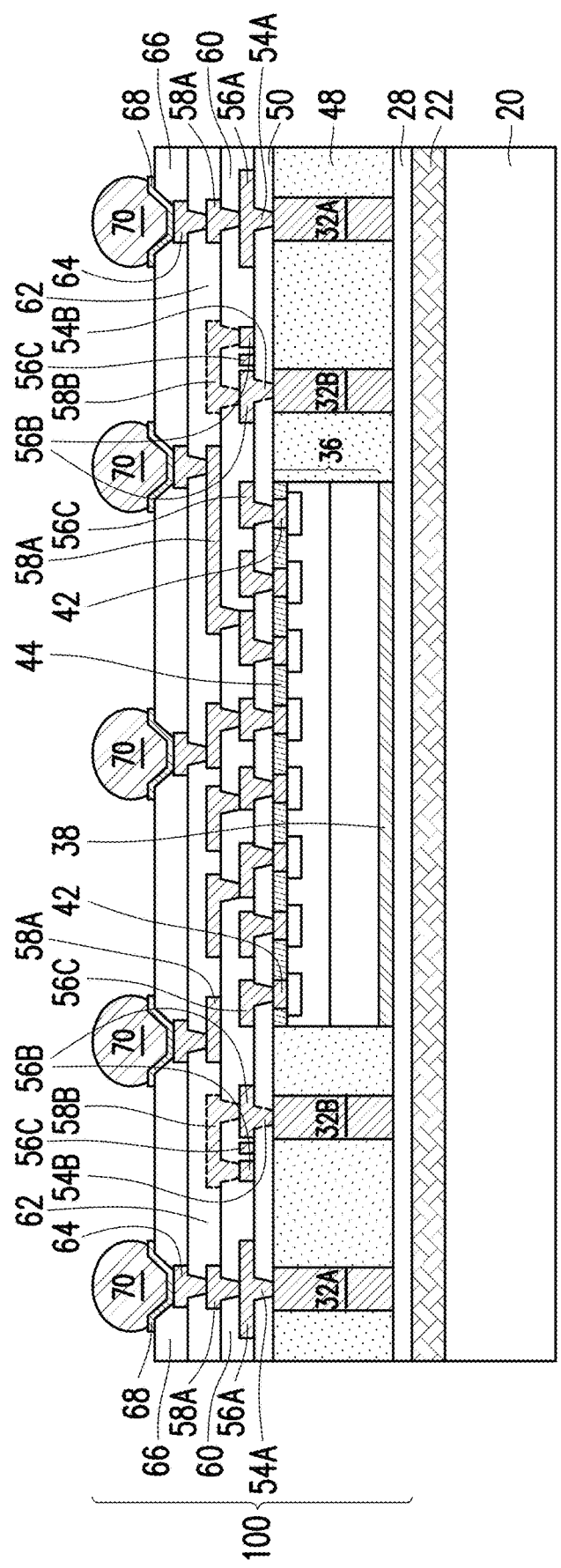

FIG. 12 illustrates the formation of dielectric layer 66, Under-Bump Metallurgies (UBMs) 68, and electrical connectors 70 in accordance with some exemplary embodiments. The respective step is illustrated as step 214 in the process flow shown in FIG. 22. Dielectric layer 66 may be formed of a material selected from the same group of candidate materials for forming dielectric layers 50 and 60. For example, dielectric layer 66 may be formed using PBO, polyimide, or BCB. Openings are formed in dielectric layer 66 to expose the underlying metal pads, which are parts of RDLs 64. In accordance with some embodiment of the present disclosure, UBMs 68 are formed to extend into the openings in dielectric layer 66 to contact RDLs 64. UBMs 68 may be formed of nickel, copper, titanium, or multi-layers thereof.

Electrical connectors 70 are then formed. The formation of electrical connectors 70 may include placing solder balls on the exposed portions of UBMs 68, and then reflowing the solder balls. In accordance with alternative embodiments of the present disclosure, the formation of electrical connectors 70 includes performing a plating step to form solder layers over UBMs 68, and then reflowing the solder layers. Electrical connectors 70 may also include metal pillars, or metal pillars and solder caps, which may also be formed through plating. Throughout the description, the structure including dielectric layer 28 and the overlying structure in combination is referred to as package 100, which is a composite wafer (and also referred to as composite wafer 100 hereinafter) including a plurality of device dies 36.

Figure 13:
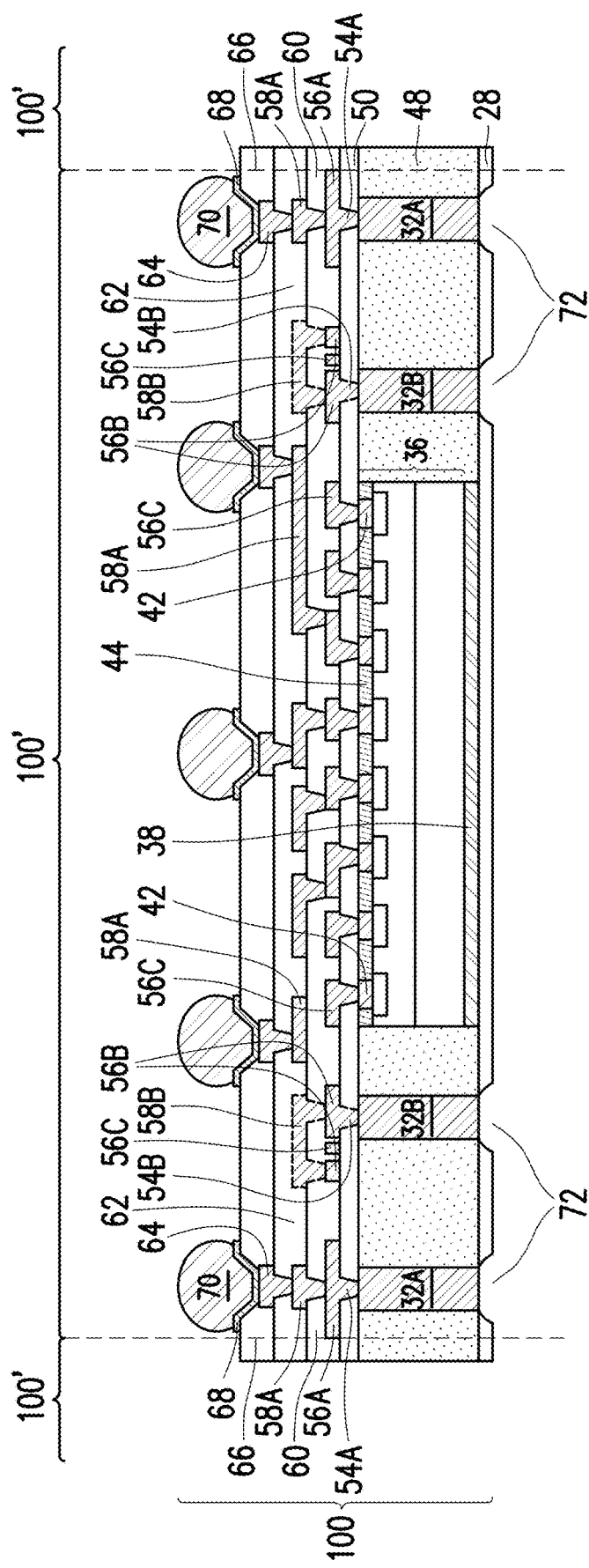

Next, package 100 is de-bonded from carrier 20, for example, by projecting a UV light or a laser beam on release layer 22, so that release layer 22 decomposes under the heat of the UV light or the laser beam. Package 100 is thus de-bonded from carrier 20. The resulting package 100 is shown in FIG. 13. In accordance with some embodiments of the present disclosure, in the resultant package 100, dielectric layer 28 remains as a bottom part of package 100, and protects through-vias 32. A laser drill is then performed to remove some portions of dielectric layer 28 to form openings 72, so that active through-vias 32A and dummy through-vias 32B are exposed. Next, a singulation (die-saw) process is performed to separate composite wafer 100 into individual packages 100'. The respective step is illustrated as step 218 in the process flow shown in FIG. 22.

Figure 14:
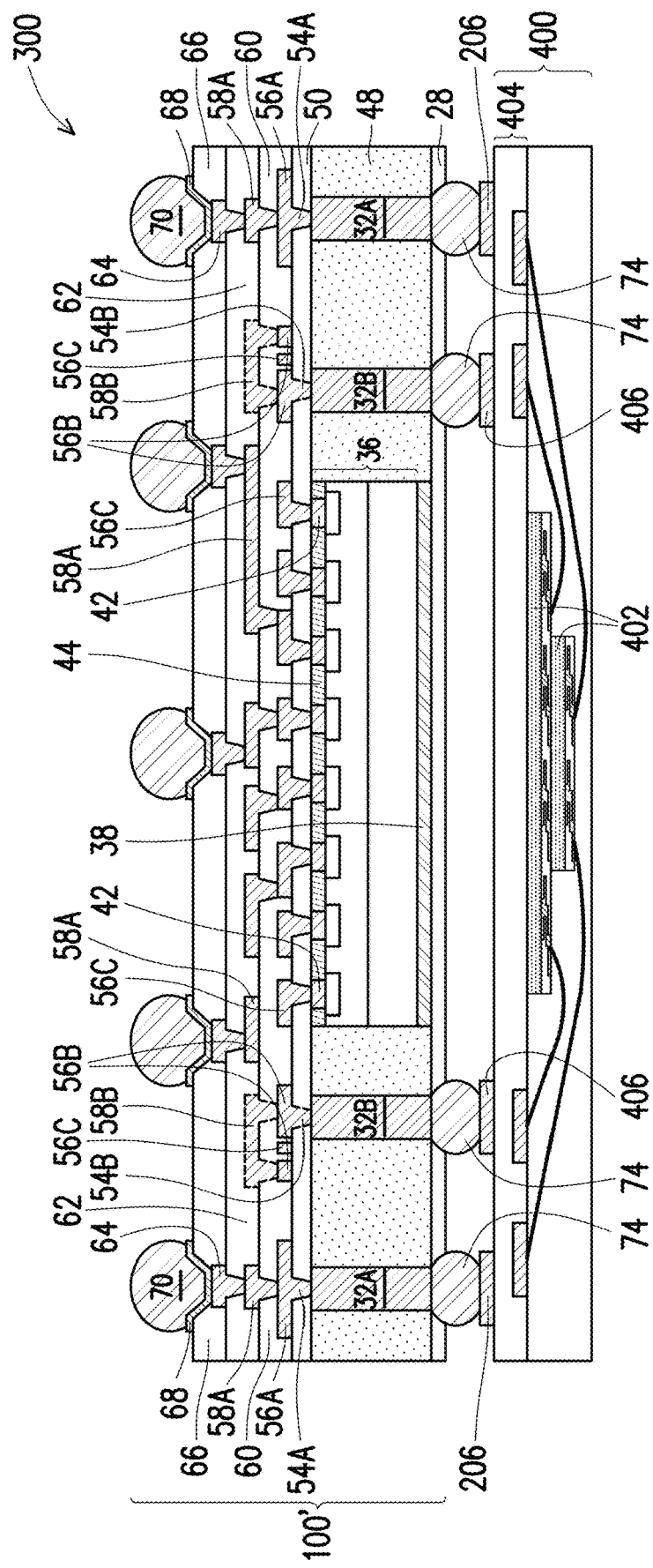

FIG. 14 illustrates the bonding of package 400 to package 100', thus forming Package-on-Package (PoP) structure/package 300. The respective step is illustrated as step 220 in the process flow shown in FIG. 22. The bonding is performed through solder regions 74, which join through-vias 32A and 32B to metal pads 406 in the underlying package 400. In accordance with some embodiments of the present disclosure, package 400 includes package substrate 404 and device die(s) 402, which may be memory dies such as Static Random Access Memory (SRAM) dies, Dynamic Random Access Memory (DRAM) dies, or the like.

In accordance with alternative embodiments of the present disclosure, instead of forming openings 72 (FIG. 13) in dielectric layer 28, and then bond package 400 to package 200' directly, backside RDLs are formed on the backside of device die 36. In order to form the backside RDLs, a carrier switch is first performed on the structure shown in FIG. 12, wherein electrical connectors 70 are adhered to carrier 80 (FIG. 15) through adhesive film 82 before the de-bonding of carrier 20.

Next, carrier 20 (FIG. 12) is de-bonded from composite wafer 100, and dielectric layer 28 is revealed. Metal features 26 (include metal caps 26A, dummy metal caps 26B, and RDLs 26C) and vias 25/25B are then formed. The formation may be similar to the formation of conductive features 56 and vias 54, and hence the details are not repeated.

Figure 15:
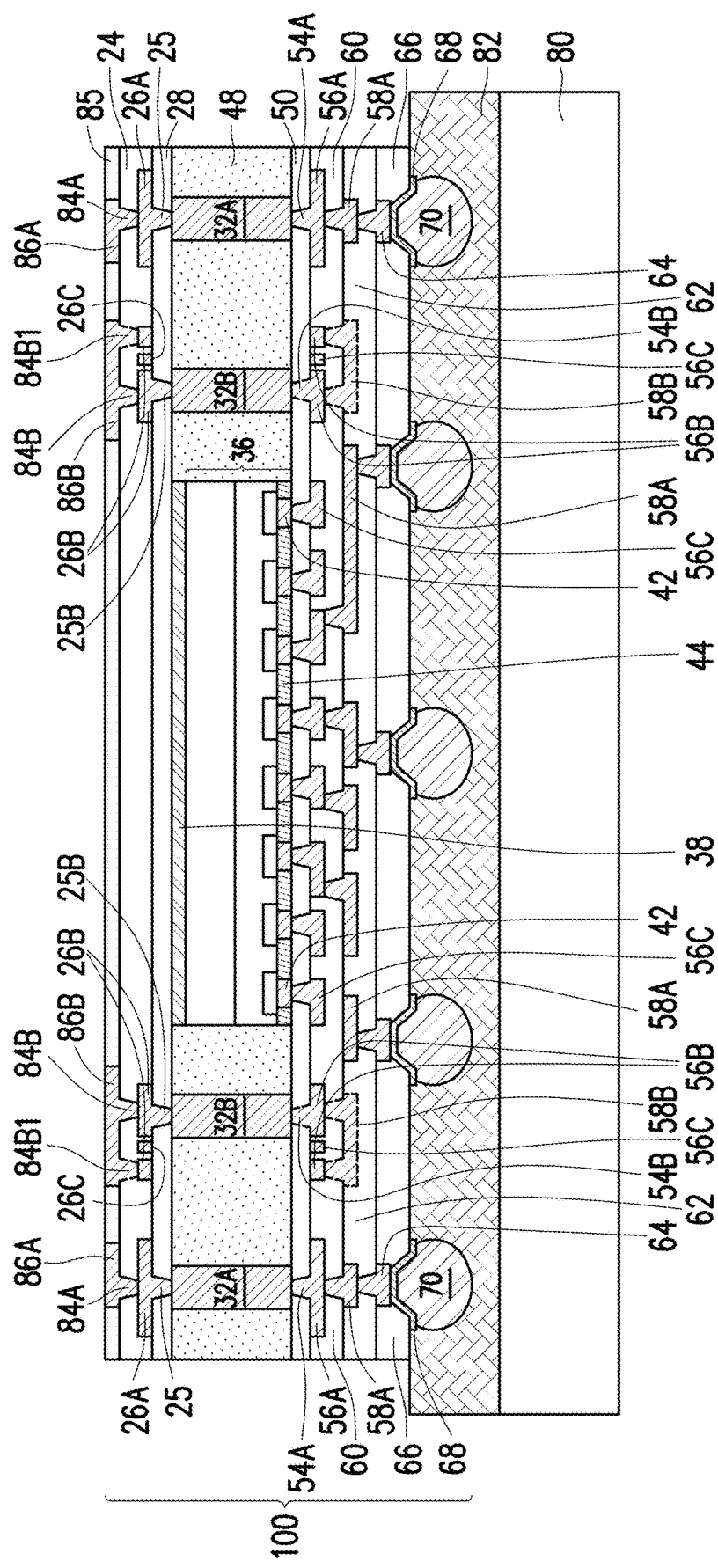
FIGS. 15 and 16 are cross-sectional views of intermediate stages in the formation of a package including both front-side and backside redistribution lines in accordance with some embodiments.

Dielectric layer 24 and metal features 86A, 86B, 84A, and 84B as shown in FIG. 15 are then formed. The respective step is illustrated as step 216 in the process flow shown in FIG. 22. Dielectric layer 24 may be formed of a material selected from the same group of candidate materials for forming dielectric layers 50 and 60. Metal features 86A/84A (which includes metal traces 86A and vias 84A) may also be formed of a metal or a metal alloy including aluminum, copper, tungsten, and/or alloys thereof. Some vias 84B1 are illustrated using dashed lines to indicate these vias may or may not be formed, and solder regions (FIG. 16) 74 may be electrically connected to some (but not all) separated pieces in a dummy metal cap 26B, or connected to all of the separated pieces in a dummy metal cap 56B through vias 84B1. Dielectric layer 85 may be (or may not be) formed. Composite wafer 100 is then de-bonded from carrier 80, and a singulation/die-saw is performed to separate composite wafer 100 into individual packages 100'. The resulting package 100' is then bonded to package 400, and the resulting package 300 is shown in FIG. 16.

Figure 16:
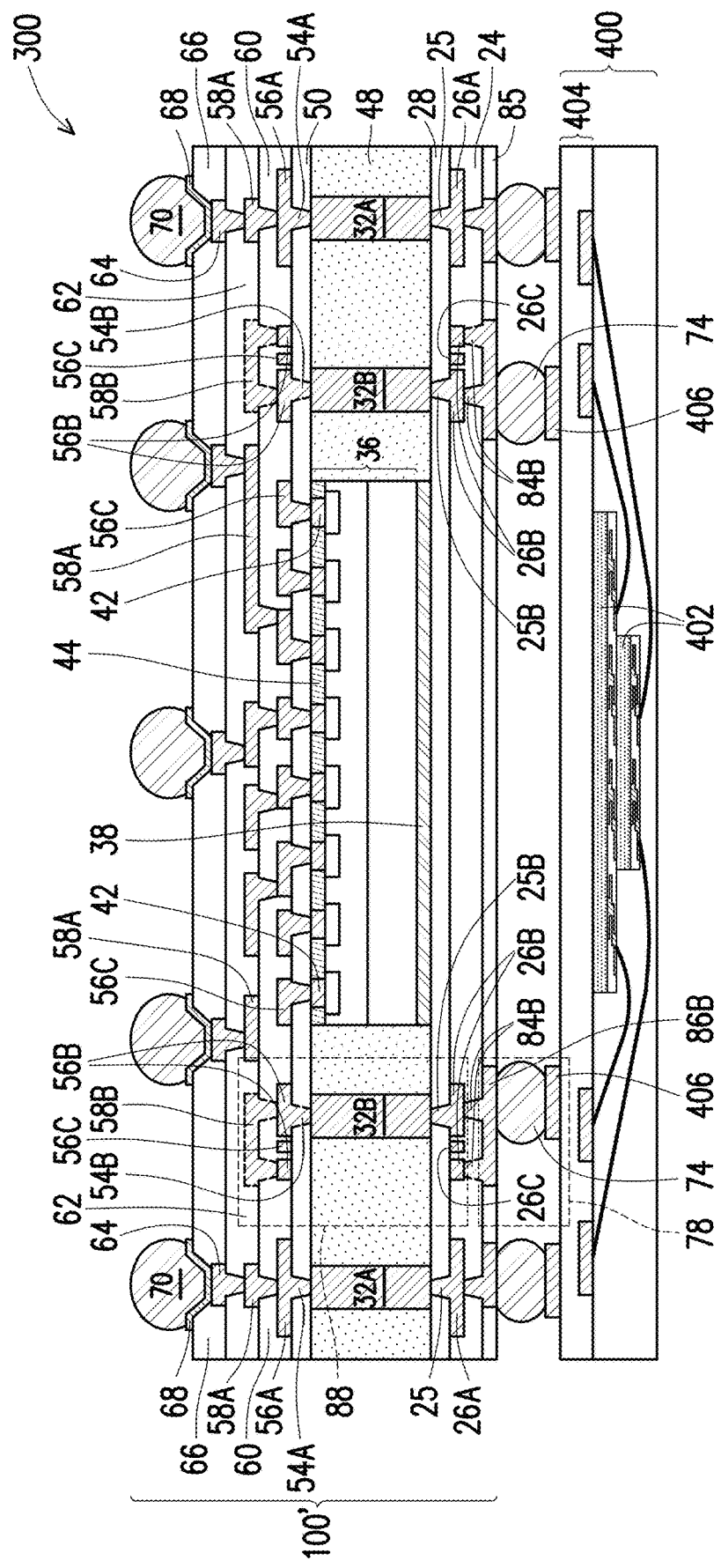

In accordance with some embodiments as shown in FIGS. 14 and 16, dummy through-vias 32B are electrically floating. For example, on the bottom sides of dummy through-vias 32B, metal pads 406 in package 400 may be dummy pads, and are not electrically connected to any underlying metal lines and device dies 402. On the top sides of dummy through-vias 32A, if vias 54B are not formed, the entire top surfaces of dummy through-vias 32B are covered by dielectric layer 50. Dummy metal cap 56B may be fully enclosed in dielectric layers 50 and 60 (when vias 54B and metal bridges 58B are not formed), or may form an integrated metal feature along with metal bridge 58B, which integrated feature may be fully enclosed in dielectric layers 50, 60, and 62 (when vias 54B are not formed). The integrated features are electrically floating. If vias 54B are formed to connect to dummy through-vias 32B, respective ones of metal bridges 58B, vias 54B and the dummy vias 32B may form interconnected metal features, which may be electrically floating.

Dummy through-vias 32B may also be electrically grounded or connected to a non-ground voltage(s), and the electrical ground or non-ground voltages may be provided by device dies 402. In accordance with some embodiments, through-vias 32B are still dummy since they are configured not to allow currents to flow through. This may be achieved since the electrical paths may be terminated at metal bridges 58B, which are not electrically connected to any overlying metal feature. The electrical paths may also be terminated at dummy metal caps 56B when no metal bridges 58B are formed. The electrical paths may also be terminated at the top ends of dummy through-vias 32B when no vias 54B are formed.

In accordance with some embodiments of the present disclosure, the conductive features shown in region 78 (FIG. 16), which include vias 84B, metal traces/pads 86B, and the solder region 70 therein are not formed. Accordingly, all of the metal features in region 88 in combination are fully insulated in dielectric materials 24, 28, 48, 50, 60, and 62, and are electrically floating. Alternatively, vias 25B are not formed, and hence the features 32B, 54B, 56B, and/or 58B are fully insulated in dielectric materials.

In accordance with alternative embodiments of the present disclosure, there may be a plurality of vias 84B formed, each connected to one of the separated piece of the same dummy metal cap 26B, and the plurality of vias 84B may be electrically connected to the same solder region 74. Dummy metal caps 26B in accordance with these embodiments may also be fully insulated in dielectric layers 24 and 28 when vias 84B are not formed.

Figure 17:
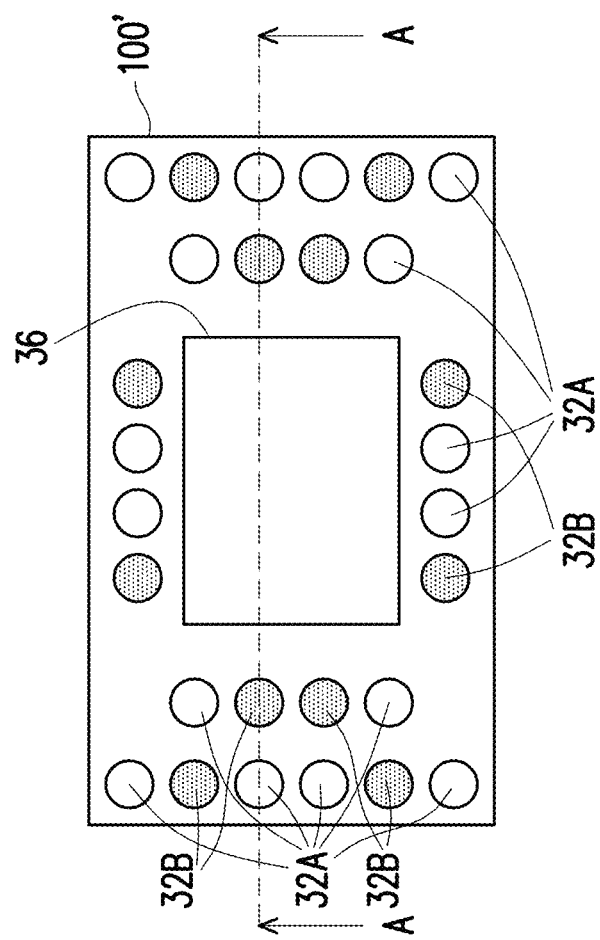
FIG. 17 is a top view of a package in accordance with some embodiments.

FIG. 17 illustrates a top view of a portion of package 100' as shown in FIGS. 14 and 16, wherein device die 36, active through-vias 32A, and dummy through-vias 32B are illustrated, and other features are not shown. It is appreciated that the illustrated layout of through-vias 32 is merely an example, and the actual number and the actual locations of through-vias 32A and 32B are determined based on the warpage situation of package 100', and are selected to reduce the warpage of package 100'. The cross-sectional views of the package 100' shown in FIGS. 14 and 16 may be obtained from the plane containing line A-A in FIG. 17.

Figure 18:
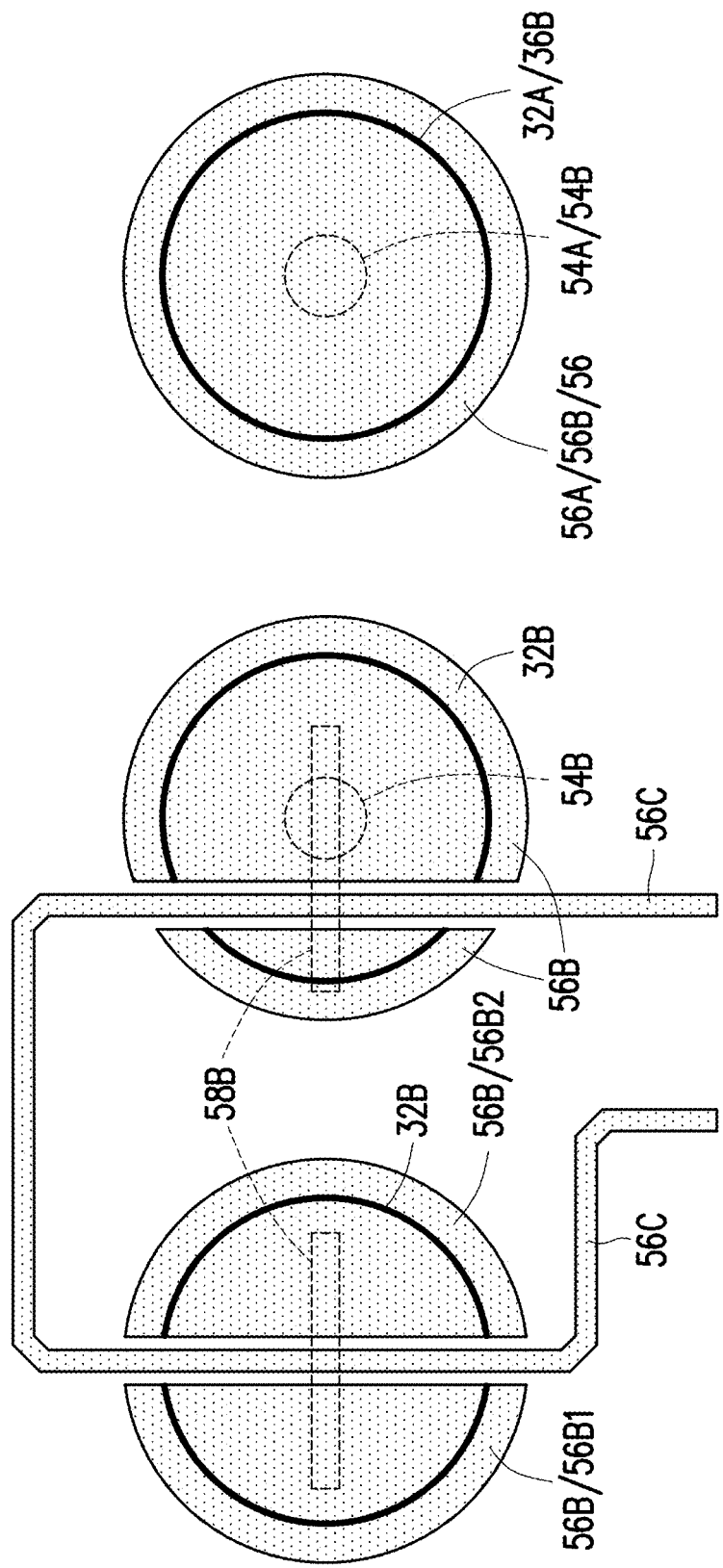

FIG. 18 illustrates the top view of active metal caps 56A and dummy metal caps 56B in accordance with some embodiments. The dummy metal caps 56B may be separated into two portions 56B1 and 56B2 to allow RDL 56C to pass through a gap/space arranged there-between. Accordingly, although dummy metal caps 56B are large and occupy significantly large area, the gap used by dummy metal caps 56B may still be used for routing RDLs 56C. The dummy metal cap 56B on the left side of FIG. 18 shows an example that RDL 56C passes through the middle of dummy metal cap 56B. Accordingly, no via 54B (refer to FIGS. 14 and 16) is formed to connect to the respective dummy metal cap 56B. The dummy metal cap 56B in the middle of FIG. 18 shows an example that RDL 56C passes through a location away from the middle of dummy metal cap 56B. Accordingly, via 54B may be or may not be formed to connect to the respective dummy metal cap 56B. The metal cap 56 on the right side of FIG. 18 represents an active metal cap 56A. Alternatively, the metal cap 56 on the right side of FIG. 18 represents a dummy metal cap 56B that is not separated, which may be formed in RDL-sparse regions.

Figure 19:
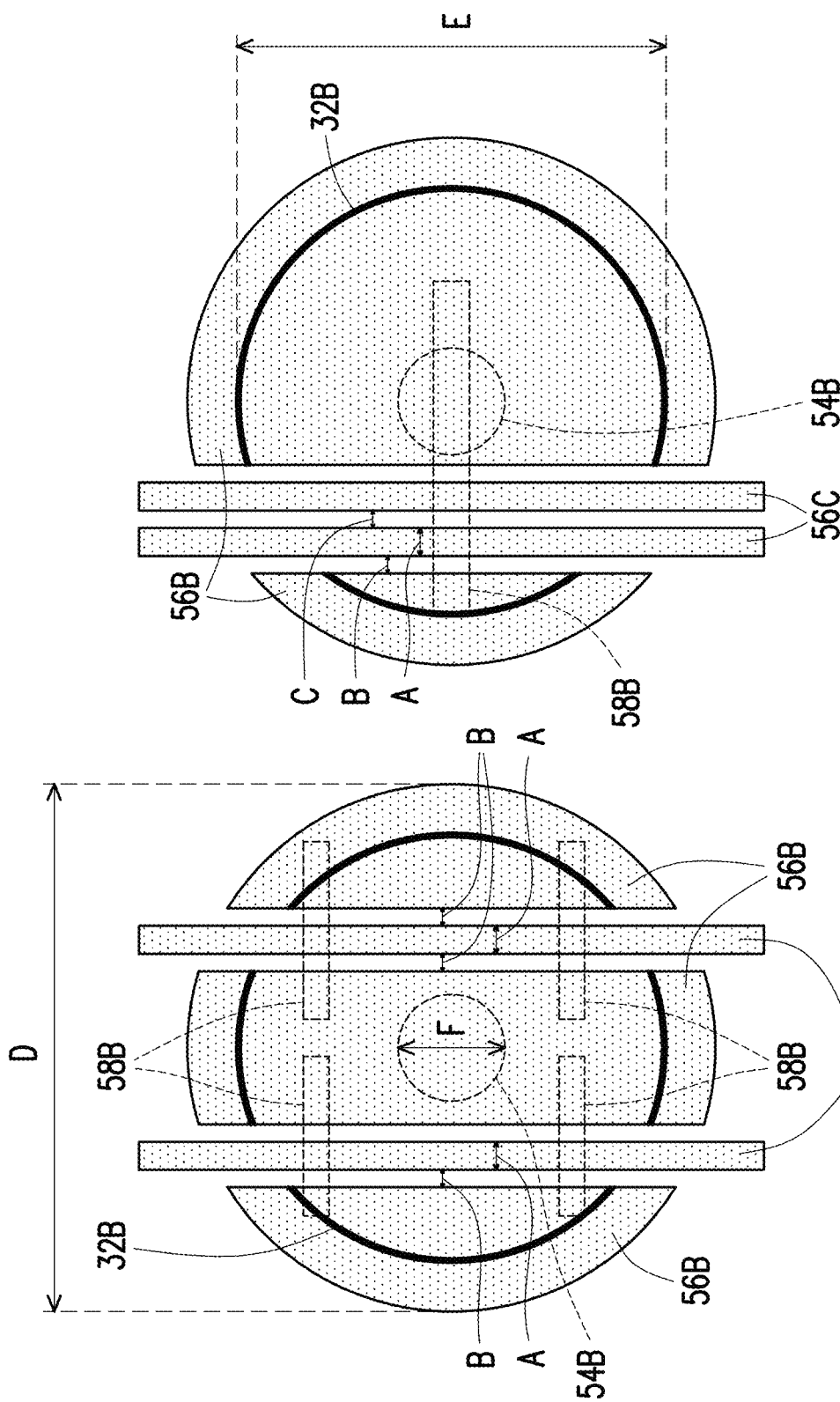

FIG. 19 illustrates some embodiments in which more than one RDL 56C pass through one dummy metal cap 56B. The left-side dummy metal cap 56B is separated into three portions with two gaps therein, with each of the gaps having one RDL 56C passing through. The right-side dummy metal cap 56B is separated into two portions, with two (or more) RDLs 56C passing through the same gap.

FIGS. 20 and 21 illustrate some embodiments in which RDLs 56C are not straight. RDLs 56C may include two or more sections forming angles α in the range between about 30 degrees and about 150 degrees. In the examples shown in FIGS. 18 through 21, metal bridges 58B are illustrated using dashed lines to indicate they are formed optionally.

Some exemplary dimensions are provided herein. It is appreciated that these dimensions are examples. Referring to FIGS. 19, 20, and 21 (with FIG. 18 having similar dimensions), the width A of redistribution line 56C and spacings B and C may be smaller than about 30 μm. The diameter D (or length or width) of dummy metal cap 56B may be in the range between about 140 μm and about 230 μm. The diameter E (or length or width) of dummy via 32B may be in the range between about 100 μm and about 190 μm. The diameter F (length or width) of dummy through-via 54B may be in the range between about 10 μm and about 60 μm.

Referring again to FIG. 16, dummy metal caps 26B are formed on the backside of device die 36, with RDLs 26C passing through dummy metal caps 26B. The layouts of dummy metal caps 26B and RDLs 26C and the respective dimensions may be essentially the same as what are shown in FIGS. 19 through 21, and are not repeated herein.

The embodiments of the present disclosure have some advantageous features. Dummy through-vias are formed to provide extra anchoring force for bonding to package 400, and to reduce the warpage of packages. Dummy through-vias, however, incurs stress to the RDL layers. To shield the stress caused by the dummy through-vias, large dummy metal caps are formed directly overlying or underlying the dummy through-vias. The dummy through-vias occupy big chip area, and adversely affect the routing of RDLs. Accordingly, in accordance with the embodiments of present disclosure, the dummy metal caps are separated into smaller portions, and RDLs are routed through the gaps between the smaller portions.

In accordance with some embodiments of the present disclosure, a package includes a first dielectric layer, a device die over and attached to the first dielectric layer, an active through-via and a dummy through-via, and an encapsulating material encapsulating the device die, the active through-via, and the dummy through-via. The package further includes a second dielectric layer over and contacting the device die, the active through-via, and the dummy through-via. An active metal cap is over and contacting the second dielectric layer and electrically coupling to the active through-via. The active metal cap overlaps the active through-via. A dummy metal cap is over and contacting the second dielectric layer. The dummy metal cap overlaps the dummy through-via. The dummy metal cap is separated into a first portion and a second portion by a gap. A redistribution line passes through the gap between the first portion and the second portion of the dummy metal cap.

In accordance with some embodiments of the present disclosure, a package includes a device die, a dummy through-via, an encapsulating material encapsulating the device die and the dummy through-via, and a first dielectric layer over and contacting the device die, the dummy through-via, and the encapsulating material. A dummy metal cap is over and contacting the first dielectric layer, wherein the dummy metal cap overlaps the dummy through-via and extends beyond edges of the dummy through-via. A redistribution line is at a same level as the dummy metal cap. The redistribution line separates the dummy metal cap into a first portion and a second portion.

In accordance with some embodiments of the present disclosure, a method includes attaching a device die to a first dielectric layer, forming an active through-via and a dummy through-via over the first dielectric layer, encapsulating the device die, the active through-via, and the dummy through-via in an encapsulating material, forming a second dielectric layer over the encapsulating material, and depositing an active metal cap, a redistribution line, and a dummy metal cap in a common process. The active metal cap and the dummy metal cap overlap the active through-via and the dummy through-via, respectively. The dummy metal cap is separated into a first portion and a second portion by the redistribution line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first dielectric layer;
a device die over the first dielectric layer;
an encapsulant encapsulating the device die;
a second dielectric layer over the encapsulant;
an active metal cap in the second dielectric layer;
a dummy metal cap in the second dielectric layer, wherein in a plane view of the package, the dummy metal cap is separated into a first portion and a second portion, and a contour of the dummy metal cap has a same shape as the active metal cap; and
a first redistribution line passing between, and physically separated from, the first portion and the second portion of the dummy metal cap.

2. The package of claim 1, wherein the active metal cap and the dummy metal cap have round top-view shapes.

3. The package of claim 1, wherein the active metal cap and the dummy metal cap have hexagonal top-view shapes or octagonal top-view shapes.

4. The package of claim 1, wherein the first portion of the dummy metal cap has a first edge facing the first redistribution line, the second portion of the dummy metal cap has a second edge facing the first redistribution line, and wherein the first edge and the second edge are parallel to each other.

5. The package of claim 1, wherein the contour of the dummy metal cap has a same size as the active metal cap.

6. The package of claim 1 further comprising an active through-via and a dummy through-via in the encapsulant, wherein the active metal cap is electrically connected to the active through-via, and the first portion of the dummy metal cap is electrically connected to the dummy through-via.

7. The package of claim 6, wherein the second portion of the dummy metal cap is further electrically connected to the dummy through-via.

8. The package of claim 1, wherein the second dielectric layer comprises:
a first additional portion separating the first portion of the dummy metal cap from the first redistribution line; and
a second additional portion separating the second portion of the dummy metal cap from the first redistribution line.

9. The package of claim 1, wherein the dummy metal cap is electrically floating.

10. A package comprising:
a device die;
an encapsulant encapsulating the device die therein;
a dielectric layer over and contacting the device die;
a dummy metal cap over and contacting the dielectric layer, wherein the dummy metal cap has a round plane-view shape; and
a redistribution line at a same level as the dummy metal cap, wherein the redistribution line separates the dummy metal cap into a first portion and a second portion.

11. The package of claim 10, wherein the first portion of the dummy metal cap is electrically floating.

12. The package of claim 11, wherein the second portion of the dummy metal cap is electrically floating.

13. The package of claim 10, wherein the first portion of the dummy metal cap is electrically connected to the second portion of the dummy metal cap.

14. The package of claim 10 further comprising a dummy through-via penetrating through the encapsulant, wherein the dummy through-via is electrically connected to the dummy metal cap.

15. The package of claim 14, wherein the dummy metal cap overlaps the dummy through-via, and extends laterally beyond edges of the dummy through-via.

16. A package comprising:
a device die;
a dummy through-via;
an encapsulant encapsulating the device die and the dummy through-via therein; and
a dummy metal cap overlapping the dummy through-via, wherein the dummy metal cap comprises:
a first portion comprising a first rounded edge and a first straight edge, wherein first opposite ends of the first rounded edge are joined to respective second opposite ends of the first straight edge; and
a second portion comprising a second rounded edge and a second straight edge, wherein third opposite ends of the second rounded edge are joined to respective fourth opposite ends of the second straight edge, and the first straight edge is parallel to the second straight edge.

17. The package of claim 16 further comprising a redistribution line at a same level as the dummy metal cap, wherein the redistribution line is between, and is spaced apart from, the first straight edge and the second straight edge.

18. The package of claim 17, wherein a top surface of the redistribution line is coplanar with top surfaces of the first portion and the second portion of the dummy metal cap.

19. The package of claim 17 further comprising a metal line over and electrically connected to both of the first portion and the second portion of the dummy metal cap, wherein the metal line crosses over the redistribution line.

20. The package of claim 16, wherein the first rounded edge and the second rounded edge are parts of a circle.

\* \* \* \* \*